(12) United States Patent
Negishi (10) Patent No.: US 6,606,985 B2
(45) Date of Patent: Aug. 19, 2003

(54) DUAL-CUTTING METHOD DEVOID OF USELESS STROKES

(75) Inventor: Katsuharu Negishi, Tokyo (JP)

(73) Assignee: Disco Corporation, Tokyo (JP)

( * ) Notice: Subject to any disclaimer, the term of this patent is extended or adjusted under 35 U.S.C. 154(b) by 44 days.

(21) Appl. No.: 10/059,213

(22) Filed: Jan. 31, 2002

(65) Prior Publication Data

US 2002/0104422 A1 Aug. 8, 2002

(30) Foreign Application Priority Data

Feb. 7, 2001 (JP) ........................................ 2001-030929

(51) Int. Cl.[7] .............................................. B28D 1/04
(52) U.S. Cl. ......................... 125/13.01; 125/2; 451/41; 451/11; 451/5; 83/425.2
(58) Field of Search ...................... 125/13.01, 23.01; 451/41; 83/13, 425.2, 471.3

(56) References Cited

U.S. PATENT DOCUMENTS

| 4,688,540 | A | * | 8/1987 | Ono | ........................ | 125/13.01 |
| 5,842,461 | A | * | 12/1998 | Azuma | .................... | 125/13.01 |
| 6,102,023 | A | * | 8/2000 | Ishiwata et al. | ......... | 125/13.01 |
| 6,119,675 | A | * | 9/2000 | Akram et al. | ............ | 125/23.01 |
| 6,250,192 | B1 | * | 6/2001 | Akram et al. | .................. | 83/495 |
| 6,422,227 | B1 | * | 7/2002 | Kobayashi et al. | ...... | 125/13.01 |
| 6,427,676 | B2 | * | 8/2002 | Akram et al. | ............ | 125/23.01 |
| 2001/0023973 | A1 | * | 9/2001 | Akram et al. | ................ | 257/499 |
| 2002/0184982 | A1 | * | 12/2002 | Smith et al. | .................... | 83/39 |

FOREIGN PATENT DOCUMENTS

| JP | 11-026402 | | 1/1999 |
| JP | 2001-230221 | * | 8/2001 |

* cited by examiner

Primary Examiner—M. Rachuba
(74) Attorney, Agent, or Firm—Rader, Fishman & Grauer PLLC (57) ABSTRACT

Disclosed is a dual-cutting method devoid of useless strokes of cutting blades across a workpiece. The work piece has cross lines drawn in the form of lattice, and it is divided into the intermediate and opposite side zones. Two lines of substantially equal length are selected in the intermediate zone to be cut simultaneously every time the two cutting blades have been moved line-to-line distance for indexing. One of the two cutting blades is allotted to one of the opposite side zones, and the other cutting blade is allotted to the other side zone. As is the case with the cutting in the intermediate zone, two lines of substantially equal length are selected in the opposite side zones to be cut simultaneously every time the two cutting blades have been moved line-to-line distance for indexing.

2 Claims, 9 Drawing Sheets

DUAL-CUTTING METHOD DEVOID OF USELESS STROKES

BACKGROUND OF THE INVENTION

1. Field of the Invention

The present invention relates to a method of cutting a workpiece such as a semiconductor wafer using a cutting apparatus having two cutting blades equipped therewith.

2. Related Arts

Figure 5:
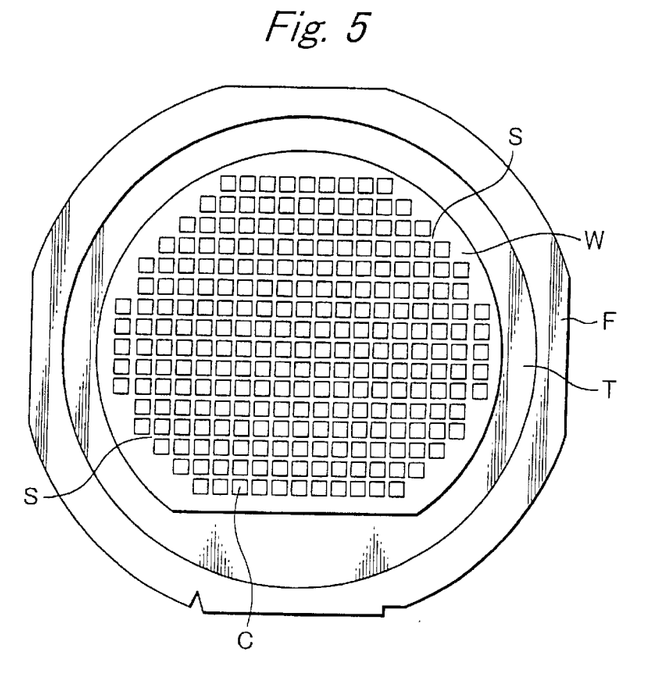
FIG. 5 is a plane view of a semiconductor wafer to be diced.

Referring to FIG. 5, a semiconductor wafer W has a plurality of cross streets S to define a lattice pattern thereon, each square area having a circuit pattern formed thereon. The semiconductor wafer W can be diced into a plurality of square chips C.

Figure 6:
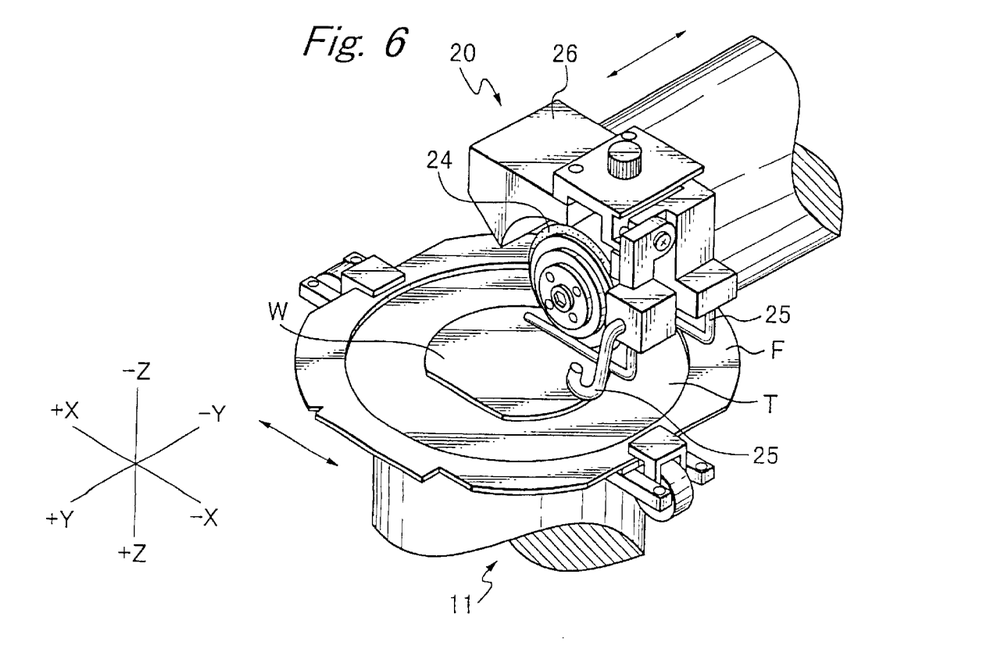
FIG. 6 illustrates how a semiconductor wafer can be diced with the cutting means.

Referring to FIG. 6, such a semiconductor wafer W is attached to a holder frame F by using a piece of adhesive sheet T, and the wafer-and-frame combination is fixedly supported by a chuck table 11. Then, a cutting means 20 is lowered in the Z-axial direction until its cutting blade 24 has reached the surface of the semiconductor wafer W, and the chuck table 11 is moved in the X-axial direction while the cutting blade 24 is rotated at an increased speed. Every time the cutting in the X-axial direction has been finished, the cutting means 20 is moved the street-to-street distance in the Y-axial direction for indexing, and then, the cutting in the X-axial direction is repeated.

Figure 7:
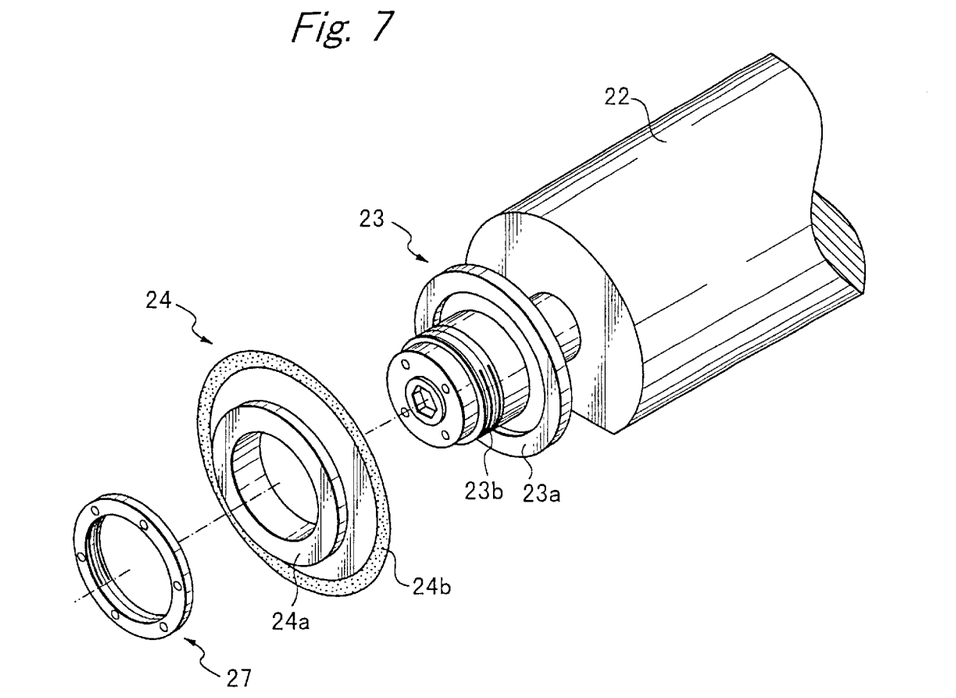
FIG. 7 is an exploded view of the cutting means.
Figure 8:
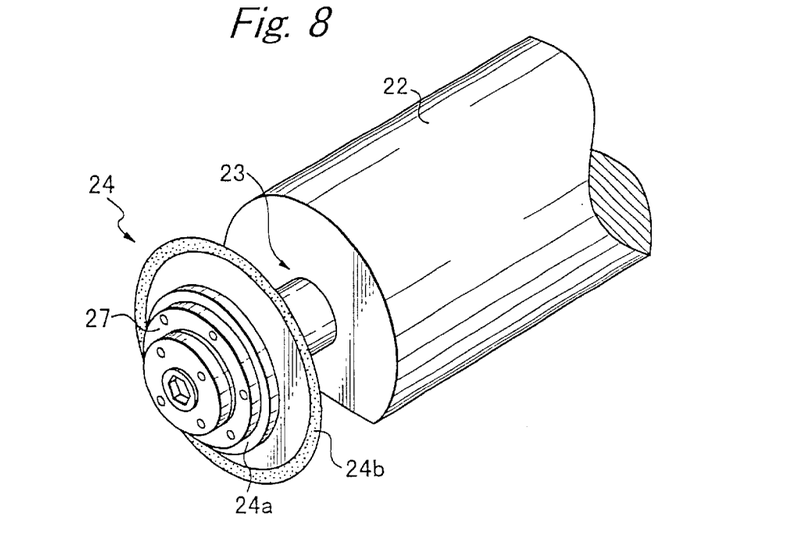
FIG. 8 is a perspective view of the main part of the cutting means.

Referring to FIGS. 7 and 8, the cutting means 20 comprises a housing 22, a rotary shaft 23 rotatably supported by the housing 22, the rotary shaft 23 having a blade mount 23a integrally connected to its end, a fastening nut 27 to be mated with the male threads 23b formed on the blade mount 23a, and a cutting blade 24 to be fixed to the mount 23a by fastening with the nut 27. The cutting blade 24 comprises an annular hub 24a and a cutting edge 24b integrally connected to the annular hub 24a. As seen from FIG. 6, the cutting bade 24 is covered by a blade casing 26, and a pair of coolant supply nozzles 25 are so positioned that cooling water may flush to the place at which the cutting is being effected.

Figure 9:
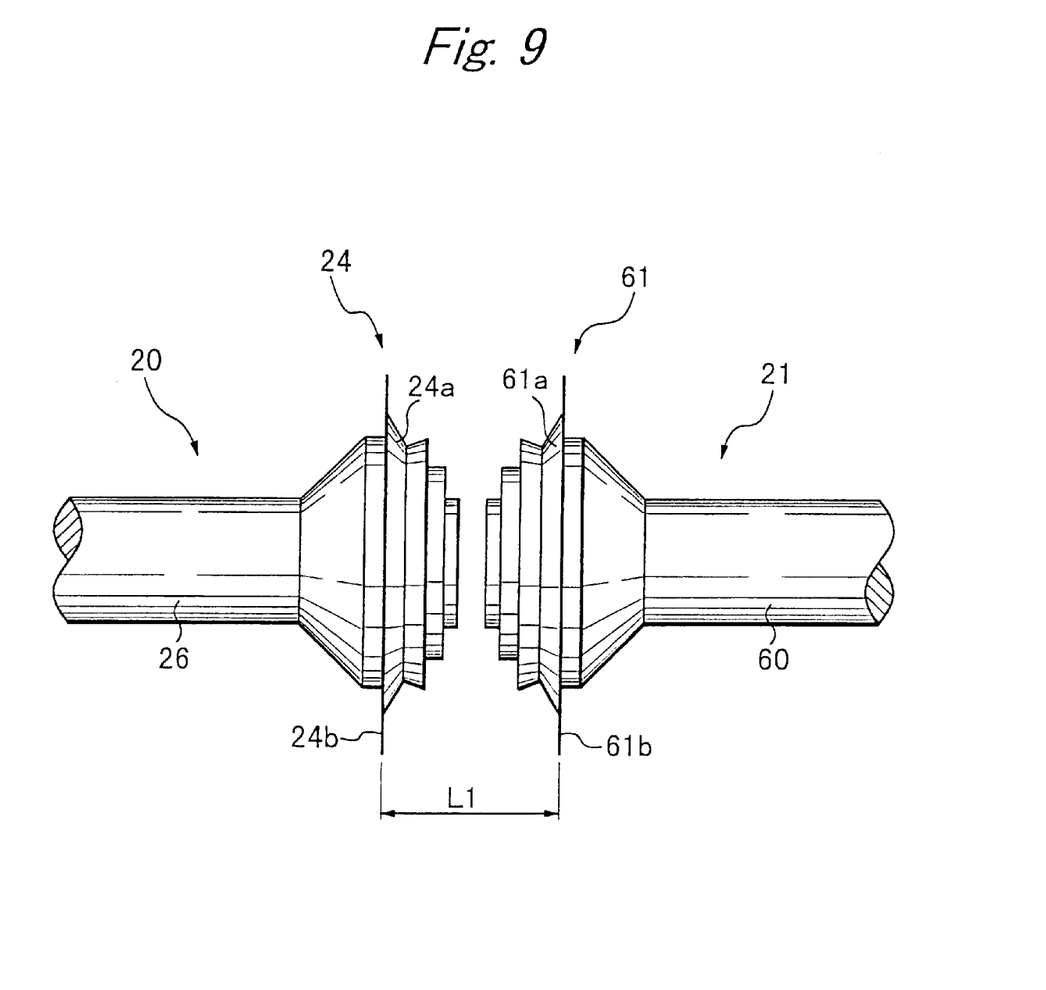
FIG. 9 is a front view of two cutting means arranged in confronting condition.

Some cutting apparatuses, as for instance, disclosed in Japanese Patent 11-26402(A) use two cutting means such as shown in FIGS. 6, 7 and 8. Referring to FIG. 9, the first cutting blade 24 is fixed to the end of the first rotary axis 26 whereas the second cutting blade 61 is fixed to the end of the second rotary axis 60. These rotary axes 26 and 60 are aligned in line so that the first and second cutting blades 24 and 61 confront each other. With this arrangement the two cutting blades 24 and 61 can be used simultaneously in cutting the semiconductor wafer W. The efficiency with which the workpiece can be cut is increased substantially thanks to simultaneous use of two cutting blades, permitting two streets to be cut simultaneously.

Figure 10:
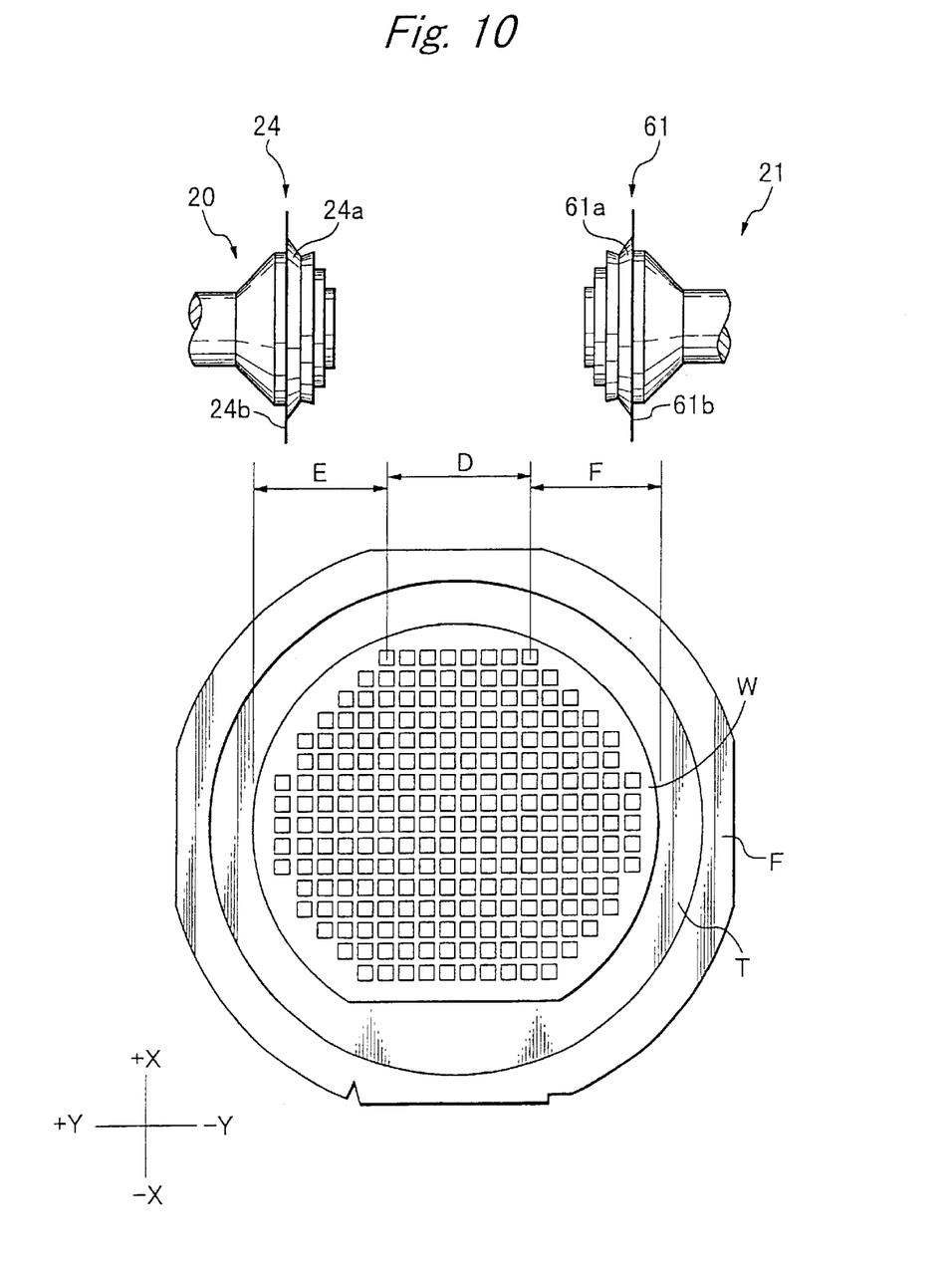
FIG. 10 shows a conventional manner in which two confronting cutting means are used in dicing a semiconductor wafer.

According to the cutting method disclosed in Japanese Patent 11-26402(A), at the outset the cutting edge 24b of the first cutting blade 24 is aligned with one of the outermost opposite streets of a circular workpiece whereas the cutting edge 61b of the second cutting blade 61 is aligned with the other outermost street, as shown in FIG. 10. These cutting blades 24 and 61 are moved stepwise toward each other by the street-to-street distance L2 every time two streets have been cut.

The first and second cutting means 20 and 21 are constructed as shown in FIGS. 6, 7 and 8. Therefore, these cutting means cannot be put close to each other, leaving a minimum distance L1 (equal to the total thickness of their hub projections 24a and 61a), which is larger than the street-to-street distance L2 in the intermediate zone D of the workpiece W. As a matter of fact, the minimum edge-to-edge distance L1 is 5 times as large as the street-to-street distance L2, thus preventing the simultaneous cutting of two streets in the intermediate zone D. Therefore, one of the first and second cutting blades 24 and 61 is used in the intermediate zone, and accordingly, the cutting efficiency is lowered.

Figure 11:
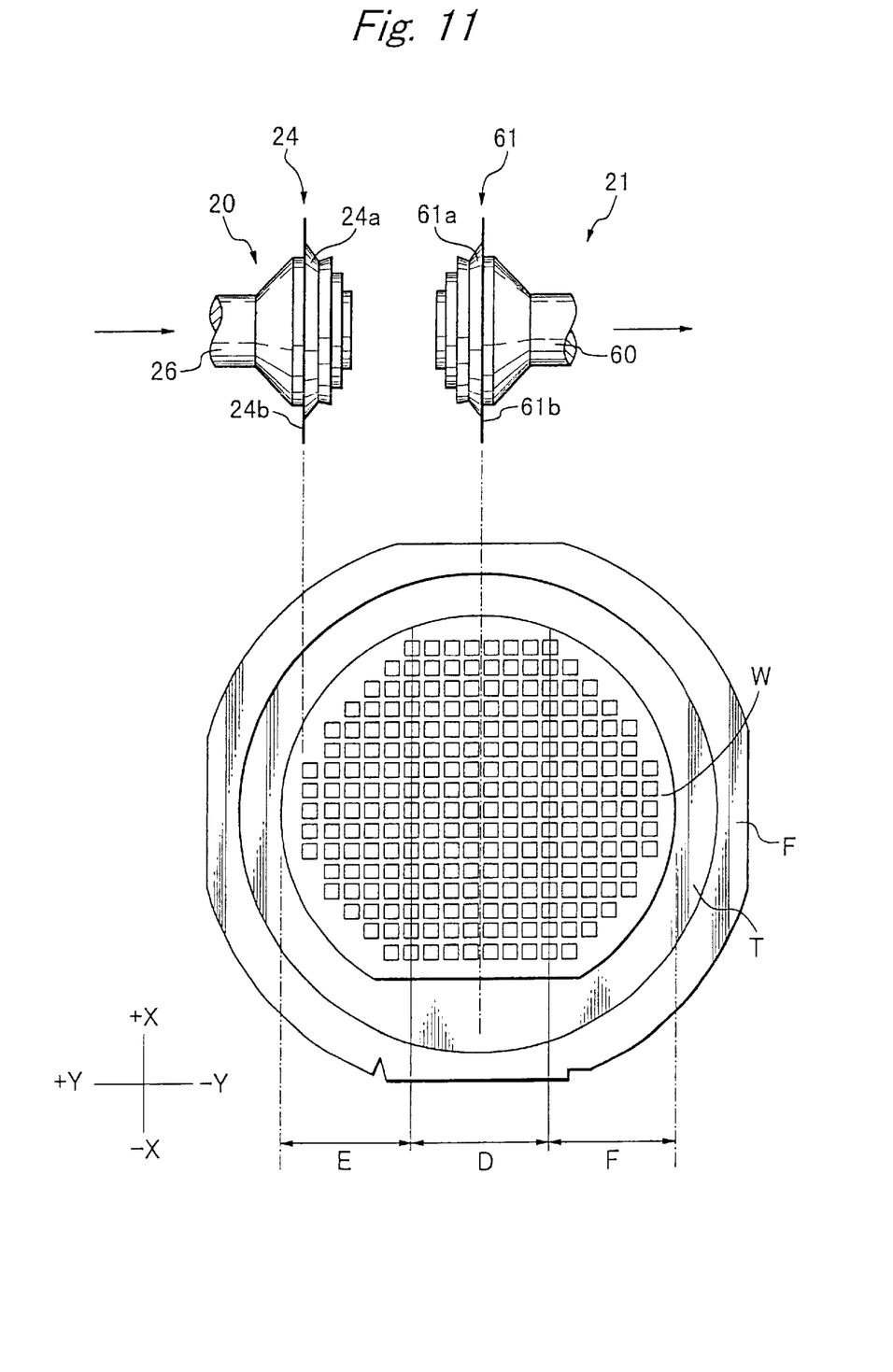
FIG. 11 shows another conventional manner in which two confronting cutting means are used in dicing a semiconductor wafer.

Referring to FIG. 11, the first cutting edge 24b is aligned with the outermost street of the side zone E of the workpiece W whereas the second cutting edge 61b is aligned with the center street of the intermediate zone D of the workpiece W. The cutting of two lines or streets S is repeated every time these cutting edges 24b and 61b have been moved the street-to-street distance in the −Y-axial direction for indexing. The workpiece such as a semiconductor wafer is a circle, and therefore, the X-axial stroke of the first cutting edge 61b in the intermediate zone D is much longer than that of the second cutting edge 24b. The X-axial stroke of the second cutting edge 24b must be extended beyond the circle to be equal to the longer stroke of the first cutting edge 61b. This will cause the second cutting edge 24b to run a significant length of useless stroke, and accordingly the cutting efficiency will be lowered.

SUMMARY OF THE INVENTION

One object of the present invention is to provide a method of cutting a workpiece at an increased efficiency or a dual-cutting method devoid of useless strokes of cutting blades across a workpiece.

To attain this object, a method of cutting a workpiece with the aid of a cutting apparatus comprising: at least a first cutting means whose first rotary shaft has a first cutting blade fixed to its end; a second cutting means whose second rotary shaft has a second cutting blade fixed to its end; each first and second cutting blades has a circular cutting edge on its periphery; guide means for holding the first and second cutting means with their center axes aligned in line, and for supporting movably the first and second cutting blades in the confronting relation, thereby permitting them to be fed for indexing; and a chuck table adapted to be moved in the cutting direction perpendicular to the indexing direction, thereby making the first and second cutting edges cut a plurality of parallel lines separated at a predetermined interval in the workpiece while the chuck table is being fed in the cutting direction, is improved in that the method comprises:

the first step of: separating one of the first and second cutting means from the other at such an edge-to-edge distance that the first and second cutting edges may be separated two or more integer "n" times the line-to-line distance; putting one of the first and second cutting means in alignment with the particular center line at the center of the intermediate zone of the workpiece, allowing the other cutting means to remain the edge-to-edge distance apart; and cutting the workpiece with the first and second cutting blades simultaneously; and cutting 2n lines every two lines longitudinally every time the first and second cutting means have been fed the line-to-line distance laterally; and the second step, which is subsequent or antecedent to the first step, of: allotting one of the first and second cutting edge to one of the opposite sides of the intermediate zone and the other cutting edge to the other side to cut two lines longitudinally in the opposite side zones every time the first and second cutting means have been fed the line-to-line distance laterally so that the first and second cutting edges may be brought close to each other or apart from each other.

The workpiece may be a semiconductor wafer having cross streets drawn to draw a lattice pattern on its surface, the workpiece being diced into square chips by cutting crosswise.

Other objects and advantages of the present invention will be understood from the following description of a preferred embodiment, which is illustrated in accompanying drawings.

DETAILED DESCRIPTION OF PREFERRED EMBODIMENT

Figure 1:
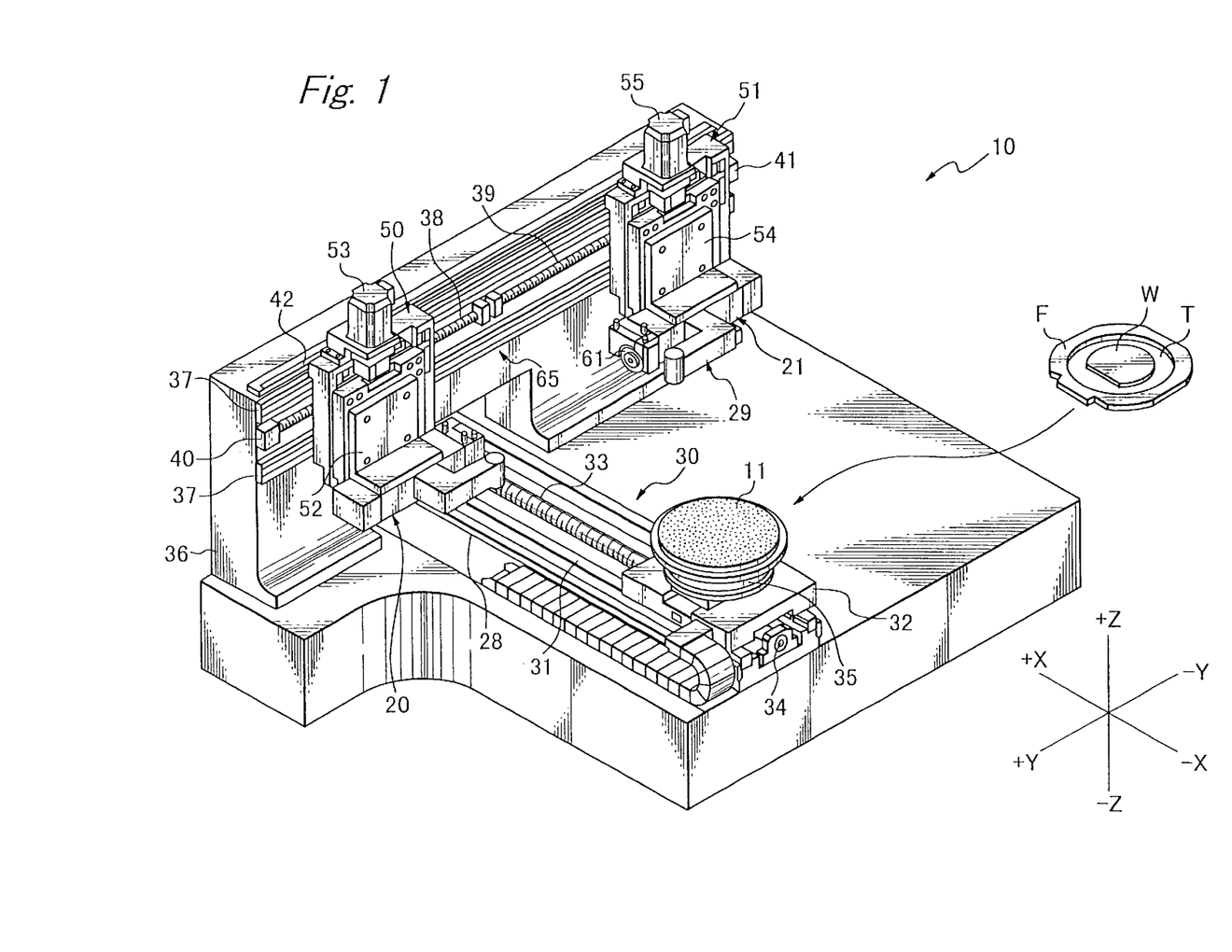
FIG. 1 is a perspective view of a cutting apparatus to be used in cutting a workpiece according to the present invention.

FIG. 1 shows a dual-spindle type of cutting apparatus which can be used in dicing a semiconductor wafer W according to the present invention. In the drawing same parts as in FIGS. 5 to 11 are indicated by same reference numerals. The cutting apparatus 10 includes first cutting means 20 whose first rotary shaft has a first cutting blade fixed to its end and second cutting means 21 whose second rotary shaft has a second cutting blade fixed to its end. A chuck table 11 can be moved in the cutting direction (or the X-axial direction) perpendicular both to the indexing direction (or the Y-axial direction) and to the rising-and-lowering direction (or in the Z-axial direction), in which the first and second cutting means 20 and 21 can be raised or lowered. With this arrangement the first and second cutting blades 24 and 61 cut two parallel lines separated at a predetermined interval in the semiconductor wafer W while the chuck table 11 is being fed in the X-axial direction.

The semiconductor wafer W is attached to a holder frame F via a piece of adhesive sheet T, and the wafer-and-frame combination is sucked onto the chuck table 11 by applying a negative pressure thereto. The semiconductor wafer W has same lattice pattern as shown in FIG. 5, and the cutting means 20 and 21 are same as shown in FIGS. 7 and 8.

The chuck table 11 is driven in the X-axial direction by a feeding-and-cutting drive means 30 until the area of the semiconductor wafer W to be cut has been put in the place in which first and second alignment means 28 and 29 can detect selected streets to be cut first on the semiconductor wafer W. The first and second cutting means 20 and 21 are moved in the Y-axial direction to be aligned with these selected streets, which are separated a predetermined distance apart from each other, and then, these separate streets are cut first.

The feeding-and-cutting drive means 30 comprises an X-axial guide rail 31, a movable support 32 slidably fixed to the X-axial guide rail 31, a screw rod 33 threadedly engaged with the female-tapped section of the movable support 32 and an X-axial stepping motor 34 whose shaft is connected to the screw rod 33. The chuck table 11 is rotatably fixed to a support base 35, which is fixed to the movable support 32. When the X-axial stepping motor 34 is rotated, the chuck table 11 is driven in the X-axial direction via the screw rod 33.

The first and second cutting means 20 and 21 are movably supported on the guide means 65, thereby permitting them to be fed and indexed in the Y-axial direction. The guide means 65 is fixed to an upright traverse 36, which extends in the Y-axial direction, and has an arch-like pass through to allow the chuck table 11 to pass through the traverse 36. A pair of Y-axial guide rails 37 are laid on the traverse 36, and first and second screw rods 38 and 39 are aligned in line, and are laid on the traverse 36 to run parallel with the Y-axial guide rails 37. First and second stepping motors 40 and 41 are connected to the first and second screw rods 38 and 39 respectively.

The Y-axial guide rails 37 support movably first and second supports 50 and 51, the female-thread sections of which supports 50 and 51 are threadedly engaged with the first and second screw rods 38 and 39 respectively. First and second Y-axial stepping motors 40 and 41 are connected to the first and second screw rods 38 and 39. The step-wise rotation of each stepping motor 38 or 39 drives the first or second support 50 or 51 independently via the associated screw rod 38 or 39 in the Y-axial direction.

The instantaneous position of the first or second support 50 or 51 can be determined by linear scales 42, thus permitting the instantaneous Y-axial position to be determined with precision. Two separate scales may be allotted to the first and second supports 50 and 51, but a single scale may be used to determine their positions with precision better than two scales.

A first rising-and-descending plate 52 bears the first cutting means 20, and it is movably fixed to the first support 50 for raising or lowering by an associated Z-axial stepping motor 53. Likewise, a second rising-and-descending plate 54 bears the second cutting means 21, and it is movably fixed to the second support 51 for raising or lowering by an associated Z-axial stepping motor 55. The cutting depth in the workpiece can be controlled by the rising-and-descending plates 52 and 54.

A semiconductor wafer W attached to the frame F via the piece of adhesive sheet T (see FIG. 2) is cut with the first and second cutting means 20 and 21, the simultaneous two-street cutting starting with the intermediate zone A, shifting to the opposite side areas B and C after finishing the cutting in the intermediate zone A.

Figure 2:
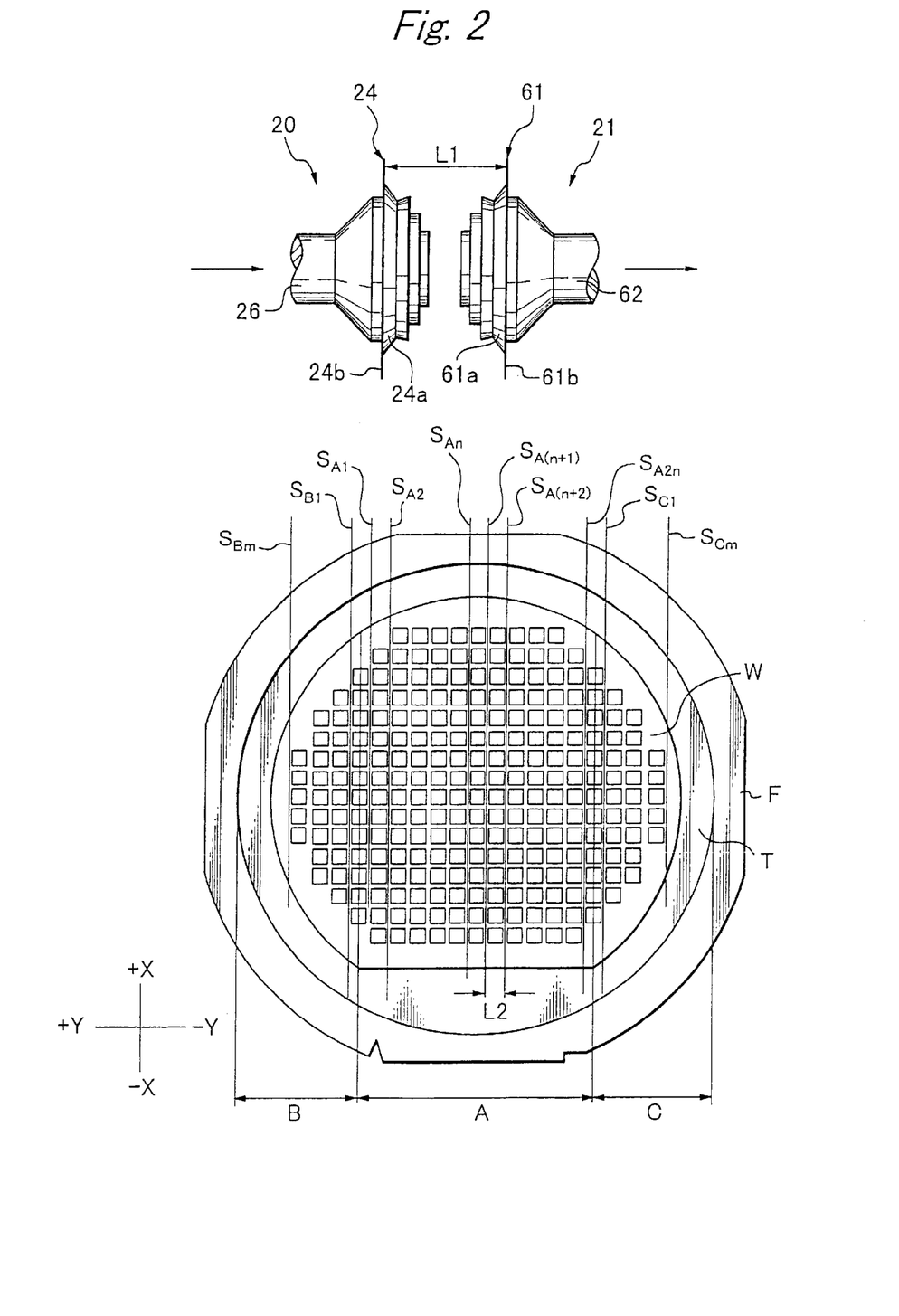
FIG. 2 shows the first and second cutting means and a semiconductor wafer to be diced.

Referring to FIG. 2, the minimum space L1 between the confronting first and second cutting blades 24 and 61 (or the shortest edge-to-edge distance) is longer than the street-to-street interspace L2, and the intermediate zone A is two or more integer "n" times as wide as the street-to-street interspace L2, and is longer than the shortest edge-to-edge interspace. The intermediate zone A has n streets parallel-running on either side of the center axis of the circle. The number n includes the centerline in case of an odd number of streets whereas it includes one of two center streets in case of a round number of streets.

Either side zone B or C is contiguous to the intermediate zone A. Only for the sake of explanation the intermediate zone A has 2n streets formed therein, and either side zone has m streets formed therein.

As shown, same hub blades are used in the first and second cutting blades 24 and 61, and the blade-and-hub combinations 24b/24a and 61b/61a confront each other with their rotary axes aligned in line.

Figure 3A:
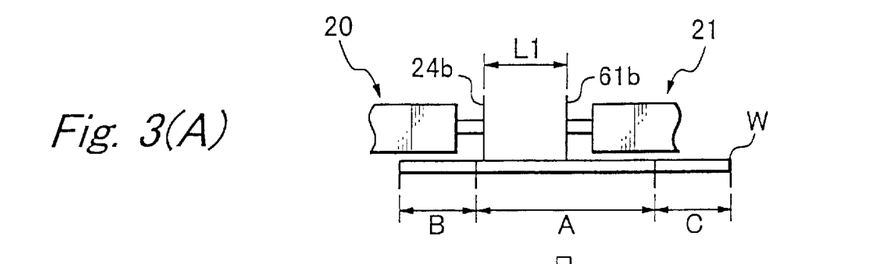
FIGS. 3(A), 3(B), 3(C) and 3(D) show how a semiconductor wafer can be diced according to the present invention.

At the outset the chuck table 11 is moved in the +X-axial direction, and at the same time, the first alignment means 28 is moved in the Y-axial direction until it has been put above the semiconductor wafer W sucked to the chuck table 11. Then, a picture of the lattice pattern of the semiconductor wafer W is taken to detect one of the outermost streets $S_{A1}$ in the intermediate zone A according to the pattern matching method. As see from FIG. 2, the cutting edge 24b of the first cutting blade 24 is moved in the Y-axial direction to be aligned with the outermost streets $S_{A1}$. The cutting edge 61b of the second cutting blade 61 is moved "n" times the street-to-street distance L2 ("n" being two or more integer) in the Y-axial direction to be aligned with the street $S_{A(n+1)}$. The cutting edge 24b is separated the distance L1 from the cutting edge 61b, as shown in FIG. 3(A). FIGS. 3 and 4 show the first and second cutting means 20 and 21 and the semiconductor wafer W schematically.

The first and second cutting means 20 and 21 are lowered one and same distance to be put in cutting position, and then the chuck table 11 is moved in the +X-axial direction, thereby allowing the first and second cutting edges 24b and 61b to cut the streets $S_{A1}$ and $S_{A(n+1)}$ respectively.

Figure 3B:
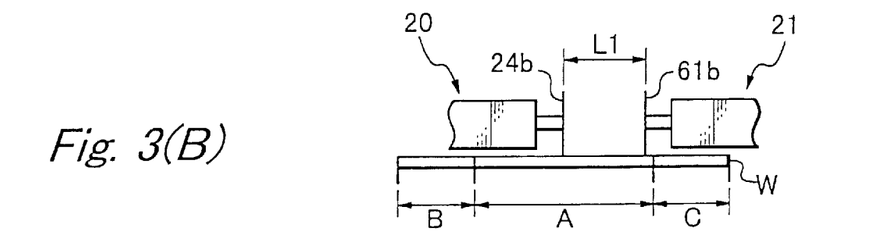

Then, the first and second cutting means 20 and 21 are moved the street-to-street distance L2 in the −Y-axial direction so that the first and second cutting edges 24b and 61b may be aligned with the streets $S_{A2}$ and $S_{A(n+2)}$ respectively.

In the same way as described above, the streets $S_{A2}$ and $S_{A(n+2)}$ are cut by the first and second cutting edges 24b and 61b simultaneously.

Figure 3C:
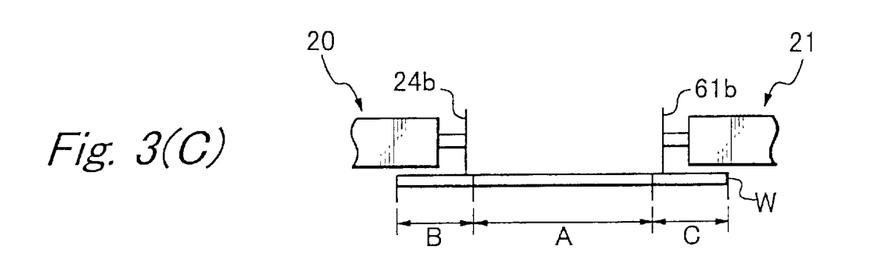
Figure 3D:
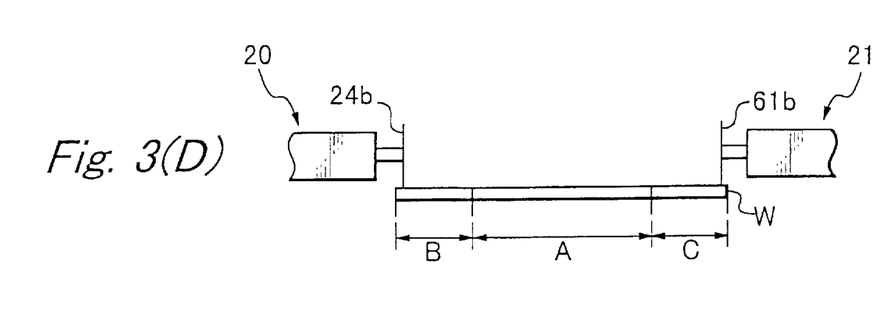

The first and second cutting means 20 and 21 are moved the street-to-street distance L2 in the −Y-axial direction while keeping their cutting edges 24b and 61b separate the distance L1, and then the chuck table 11 is moved in the +X-axial direction to cut two streets simultaneously. This is repeated until the streets $S_{An}$ and $S_{A2n}$ have been cut finally in the intermediate zone A. Thus, all streets in the intermediate zone are cut longitudinally. Then, the same cutting procedure is repeated laterally after the chuck table 11 is rotated 90 degrees, so that the intermediate zone A is cut crosswise to be divided into square chips.

After dicing the intermediate zone A of the semiconductor wafer W the opposite side zones B and C are diced by cutting two streets in these zones simultaneously with the two cutting edges 24b and 61b. It should be noted that the cutting edges travel substantially same distance in the opposite side zones as in the intermediate zone A. Thus, the semiconductor wafer can be diced at an increased efficiency; in spite of each and every street having a different length in the circular wafer two streets of equal length can be cut every time by making two cutting edges 24b and 61b travel one and same stroke, thus making full use of strokes, devoid of useless travel of each cutting edge.

Also, advantageously it is assured that both of the cutting edges 24b and 61b be worn equally because of traversing same distances across the semiconductor wafer all the time. This is advantageous to management of cutting edges in terms of their lives.

In the following example the cutting starts with the opposite side zones B and C, ending with the intermediate zone A.

At the outset the first cutting blade 24 is put in the side zone B with the first cutting edge 24b aligned with the street $S_{B1}$, and at the same time, the second cutting blade 61 is put in the side zone C with the second cutting edge 61b aligned with the street $S_{C1}$. Thus, these two streets of equal length are cut simultaneously (see FIG. 4(A)).

Figure 4A:
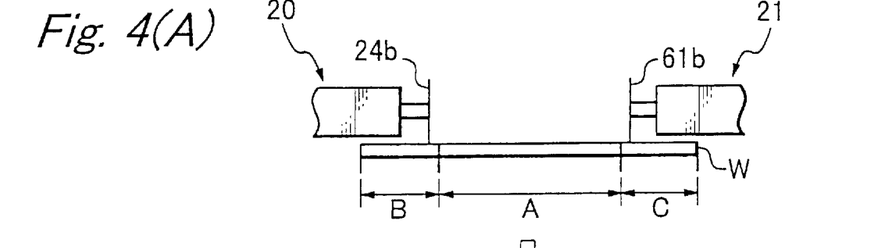
FIGS. 4(A), 4(B), 4(C) and 4(D) are similar illustrations, showing a different dicing mode according to the present invention.
Figure 4B:
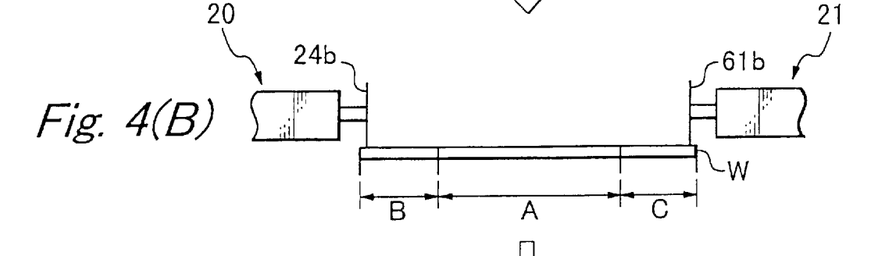
Figure 4C:
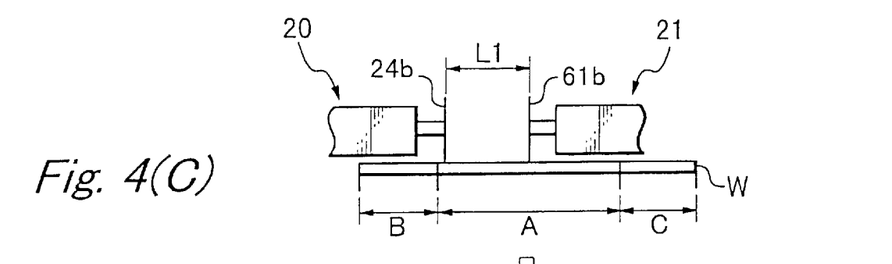

Every time the first and second cutting means 20 and 21 have been moved apart from each other by the street-to-street distance L2, two streets of equal length are cut simultaneously both in the side areas B and C, and finally the streets $S_{Bm}$ and $S_{Cm}$ are cut simultaneously in the opposite side areas B and C (see FIG. 4(B)). Thus, all streets running longitudinally in the opposite side areas B and C are cut.

Alternatively, at first, the outermost streets $S_{Bm}$ and $S_{Cm}$ are cut in the opposite side areas B and C, and subsequent cutting is repeated every time the first and second cutting means 20 and 21 have been moved toward each other by the street-to-street distance L2, and finally the innermost streets $S_{B1}$ and $S_{C1}$ are cut in the opposite side areas B and C.

Then, the first cutting blade 24 is put in the intermediate zone A with the first cutting edge 24b aligned with the outermost street $S_{A1}$, and at the same time, the second cutting blade 61 is put in the intermediate zone A with the second cutting edge 61b aligned with the center street $S_{A(n+1)}$. These two streets are cut simultaneously (see FIG. 4(C)).

Figure 4D:
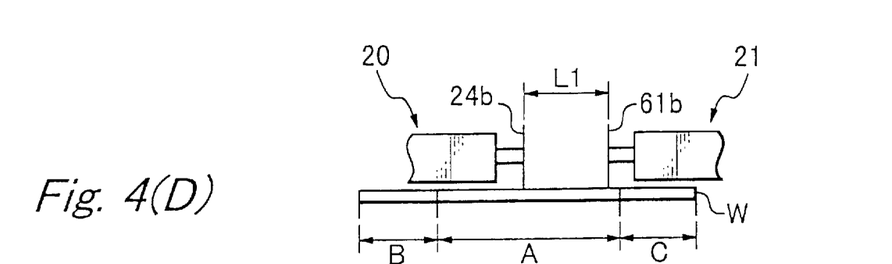

While keeping the first and second cutting means 20 and 21 separate from each other by the distance L1, these cutting means are moved the street-to-street distance L2 in the −Y-axial direction, cutting two streets of equal length simultaneously subsequent to each indexing, and finally the streets $S_{An}$ and $S_{A2n}$ are cut (see FIG. 4(D)). Then, all streets running parallel in the same direction are cut. In a case where an odd number of streets are cut in a semiconductor wafer W the final single street will remain to be cut with one cutting means. To reduce the length of time involved for cutting the final street to possible minimum, the first and second cutting means are so arranged that the outermost, shortest street in either side zone B or C may remain to be cut finally with one of the first and second cutting means.

After completing the cutting in one direction the chuck table 11 is rotated 90 degrees to perform the cutting in the other direction, and then, the semiconductor wafer is diced into squares. Contrary to the above, the lateral cutting may be performed in preference to the longitudinal cutting.

The cutting may start with the opposite side zones B and C in preference to the cutting in the intermediate zone. In this case the dicing of the semiconductor wafer may be equally performed at an increased efficiency; two streets of substantially equal length are cut simultaneously for each and every indexing.

As may be understood from the above, in a case where the blade-t-blade distance is longer than the street-to-street distance even when the first and second cutting means get closest to each other, these cutting means are allowed to cut two streets of substantial equal length simultaneously for each and every indexing, and accordingly the efficiency with which the semiconductor wafer can be diced is increased. Still, advantageously the cutting blades can be worn equally, and therefore, the life-management of such blades is facilitated.

What is claimed is:

1. A method of cutting a workpiece with the aid of a cutting apparatus comprising: at least a first cutting means whose first rotary shaft has a first cutting blade fixed to its end; a second cutting means whose second rotary shaft has a second cutting blade fixed to its end; each first and second cutting blades has a circular cutting edge on its periphery; guide means for holding the first and second cutting means with their center axes aligned in line, and for supporting movably the first and second cutting blades in the confronting relation, thereby permitting them to be fed for indexing; and a chuck table adapted to be moved in the cutting direction perpendicular to the indexing direction, thereby making the first and second cutting edges cut a plurality of parallel lines separated at a predetermined interval in the workpiece while the chuck table is being fed in the cutting direction, characterized in that the method comprises:

the first step of: separating one of the first and second cutting means from the other at such an edge-to-edge distance that the first and second cutting edges may be separated two or more integer "n" times the line-to-line distance; putting one of the first and second cutting means in alignment with the particular center line at the center of the intermediate zone of the workpiece, allowing the other cutting means to remain the edge-to-edge distance apart; and cutting the workpiece with the first and second cutting blades simultaneously; and cutting 2n lines every two lines longitudinally every time the first and second cutting means have been fed the line-to-line distance laterally; and the second step, which is subsequent or antecedent to the first step, of: allotting one of the first and second cutting edge to one of the opposite sides of the intermediate zone and the other cutting edge to the other side to cut two lines longitudinally in the opposite side zones every time the first and second cutting means have been fed the line-to-line distance laterally so that the first and second cutting edges may be brought close to each other or apart from each other.

2. Method of cutting a workpiece according to claim 1, wherein the workpiece is a semiconductor wafer having cross streets drawn in lattice pattern on its surface, the workpiece being diced into square chips by cutting crosswise.

* * * * *